United States Patent [19]

Kaufman

[11] Patent Number: 4,990,720
[45] Date of Patent: Feb. 5, 1991

[54] CIRCUIT ASSEMBLY AND METHOD WITH DIRECT BONDED TERMINAL PIN

[76] Inventor: Lance R. Kaufman, 7345 East Acoma, Scottsdale, Ariz. 85260

[21] Appl. No.: 478,467

[22] Filed: Feb. 12, 1990

Related U.S. Application Data

[63] Continuation-in-part of Ser. No. 469,350, Jan. 24, 1990, which is a continuation-in-part of Ser. No. 180,476, Apr. 12, 1988, Pat. No. 4,902,854.

[51] Int. Cl.$^5$ .............................................. H01L 23/02
[52] U.S. Cl. ..................... 174/524; 357/74; 357/70; 29/592.1
[58] Field of Search ............... 174/52.4, 52.3, 52.2, 174/52.1; 357/74, 75, 80, 70; 29/592.1

[56] References Cited

U.S. PATENT DOCUMENTS

| | | |
|---|---|---|
| 2,958,075 | 5/1976 | Kaufman . |
| 3,744,120 | 7/1973 | Burgess et al. . |
| 3,766,634 | 10/1973 | Babock et al. . |
| 3,854,892 | 12/1974 | Burgess et al. . |
| 3,911,553 | 10/1975 | Burgess et al. . |
| 3,993,411 | 11/1976 | Babock et al. . |
| 3,994,430 | 11/1976 | Cusano et al. . |
| 4,129,243 | 12/1978 | Cusano et al. . |
| 4,156,148 | 5/1979 | Kaufman . |
| 4,196,411 | 4/1980 | Kaufman . |
| 4,215,235 | 7/1980 | Kaufman . |
| 4,218,724 | 8/1980 | Kaufman . |
| 4,250,481 | 2/1981 | Kaufman . |
| 4,266,140 | 5/1981 | Kaufman . |
| 4,394,530 | 7/1983 | Kaufman . |
| 4,449,165 | 5/1984 | Kaufman . |
| 4,449,292 | 5/1984 | Kaufman . |
| 4,488,202 | 12/1984 | Kaufman . |
| 4,498,120 | 2/1985 | Kaufman . |
| 4,546,410 | 10/1985 | Kaufman . |
| 4,546,411 | 10/1985 | Kaufman . |
| 4,554,461 | 11/1985 | Kaufmann . |
| 4,574,162 | 3/1986 | Kaufman . |
| 4,577,387 | 3/1986 | Kaufman . |
| 4,630,174 | 12/1986 | Kaufman . |
| 4,700,273 | 10/1987 | Kaufman . |
| 4,713,723 | 12/1987 | Kaufman . |
| 4,724,514 | 2/1988 | Kaufman . |
| 4,736,520 | 4/1988 | Morris . |
| 4,739,449 | 4/1988 | Kaufman . |
| 4,779,060 | 10/1988 | Henden . |
| 4,788,765 | 12/1988 | Kaufman et al. . |
| 4,818,895 | 4/1989 | Kaufman . |
| 4,819,042 | 4/1989 | Kaufman . |
| 4,831,723 | 5/1989 | Kaufman . |
| 4,879,633 | 11/1989 | Kaufman . |

OTHER PUBLICATIONS

"Over 50 Years of Experience with the Direct Bond Copper Process", Tegmen Corp., 1201 E. Fayette St., Syracuse, New York 13210.

Primary Examiner—Leo P. Picard
Assistant Examiner—Bot L. Ledynh
Attorney, Agent, or Firm—Andrus, Sceales, Starke & Sawall

[57] ABSTRACT

An electric circuit assembly includes a copper pin (310) extending through aligned apertures (304, 314) in a directly bonded ceramic substrate (302) and copper lead frame (312), and directly bonded to the substrate (302). The pin (310) has an enlarged flange head (322) at one end, and is thermally deformed and enlarged at the other end (324) during the direct bonding. In another embodiment, one end (342) of a copper pin (340) extends out of an aperture (334) in a ceramic substrate (332) and slightly beyond the substrate surface (336). A lead frame (346) is directly bonded to the substrate surface (336) and droops around the protruding end (342) os the pin (340) and conforms thereto during the heating during the direct bonding. The lead frame (346) has a humped configuration over the aperture (334) in the substrate (332) and engages the protruding end (342) of the pin (340) and is deformed and raised thereby away from the substrate surface (336). In one form, the lead frame (346) is directly bonded to the substrate surface (336) around the entire perimeter of the protruding end (342) of the pin (340) and forms a hermetic seal with the substrate surface (336) peripherally surrounding the protruding pin end (342).

19 Claims, 8 Drawing Sheets

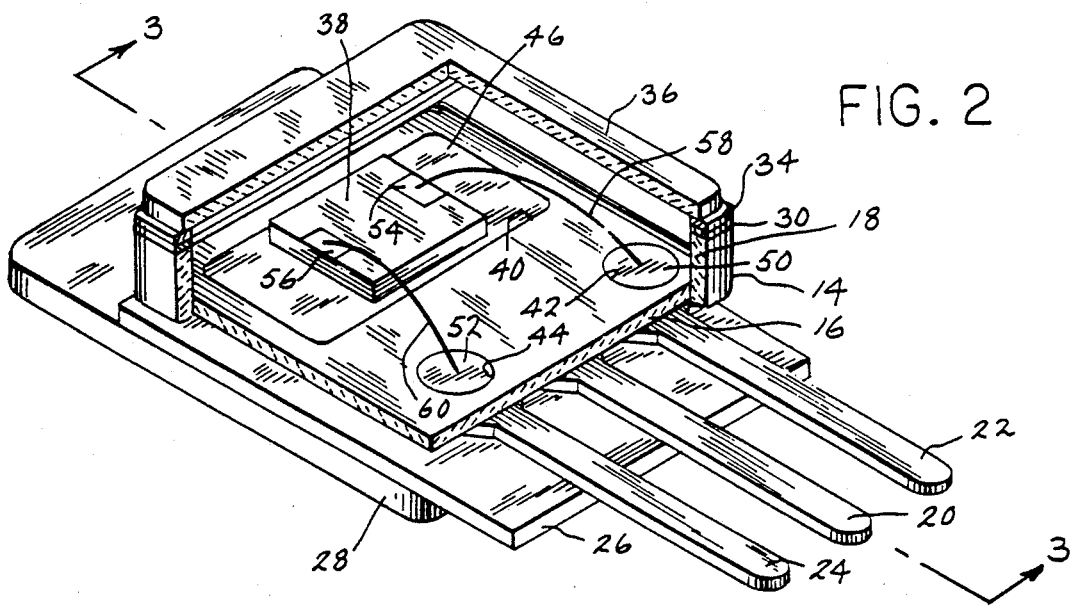
FIG. 2
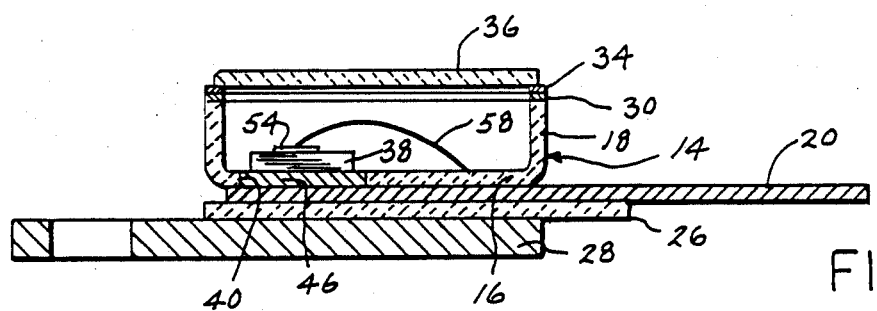
FIG. 3
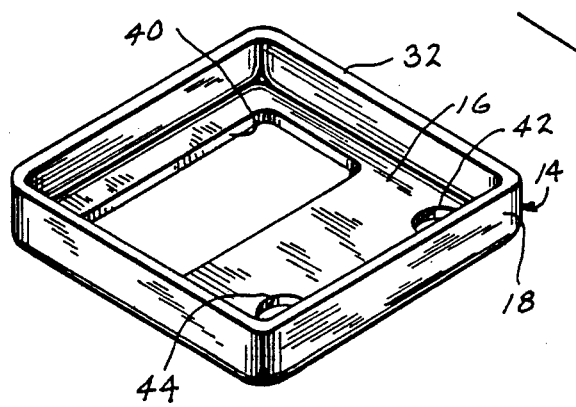
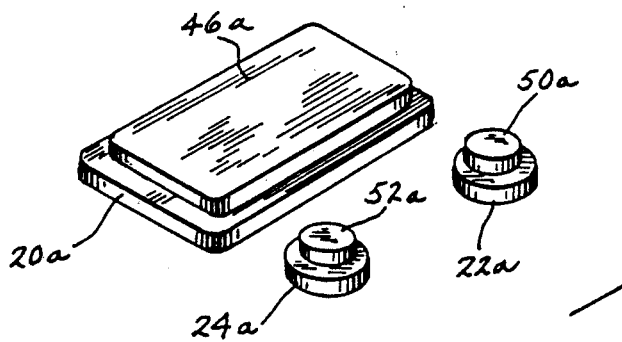
FIG. 4

CIRCUIT ASSEMBLY AND METHOD WITH DIRECT BONDED TERMINAL PIN

CROSS REFERENCE TO RELATED APPLICATIONS

This application is a continuation in part of application Ser. No. 07/469,350, filed Jan. 24, 1990, which is a continuation in part of application Ser. No. 07/180,476, filed Apr. 12, 1988 now U.S. Pat. No. 4,902,854 issued 2-20-90.

BACKGROUND AND SUMMARY

The present invention arose out of continuing development efforts in the noted parent applications. The invention provides direct bonded terminal pin structures and methods in electric circuit assemblies, including direct bond circuit assemblies of the parent applications.

Electric circuit assemblies in the field of the present invention typically include an electrically insulating thermally conductive non-metallic refractory substrate, e.g. ceramic, having electrically conductive metallic lead frames, e.g. copper, mounted on the substrate, and electric components, e.g. semiconductor chips, mounted on the lead frames. The structure is covered by an insulating housing which in turn is mounted to a heat sink such that the bottom surface of the ceramic substrate is in intimate contact with the heat sink. Examples of such circuit assemblies are noted in the parent applications.

The copper lead frames are mounted to the ceramic substrate in various manners, for example by a solder reflow operation, or by a direct bond operation, both of which processes are known in the art.

Direct bonding of the copper lead frames to the ceramic substrate involves placing the copper lead frame in contact with the ceramic substrate, heating the copper lead frame and the ceramic substrate to a temperature below the melting point of the lead frame to form a eutectic with the lead frame which wets the lead frame and the ceramic substrate, and cooling the lead frame and the substrate with the lead frame bonded to the substrate. The lead frame is pre-oxidized, and the heating is done in an inert atmosphere, or alternatively the heating is done in a reactive oxygen gas atmosphere. Examples of the direct bond process are noted in the parent applications.

The present invention arose from efforts relating to terminal pin construction assemblies and methods with direct bond processing in a hermetic sealed circuit package, and to use of terminal pins for rivet-like reinforcement, though the invention has broader application.

BRIEF DESCRIPTION OF THE DRAWINGS

Parent Applications

FIG. 2 is an assembled view of the structure of FIG. 1, partially cut away.

FIG. 3 is a sectional view taken along line 3—3 of FIG. 2.

FIG. 4 is an exploded perspective view of an alternate of a portion of FIG. 1.

Present Invention

Figure 17:
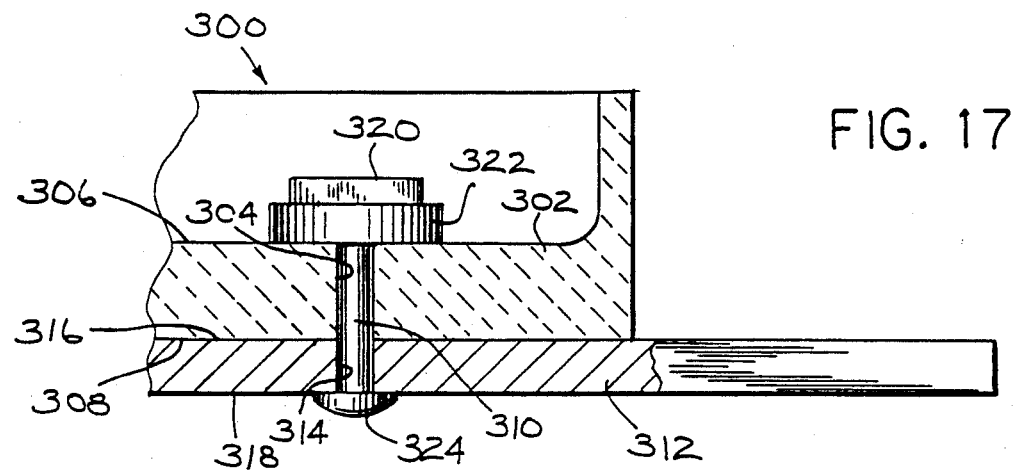

FIG. 17 is a sectional view showing an electric circuit assembly in accordance with the present invention.

Figure 18:
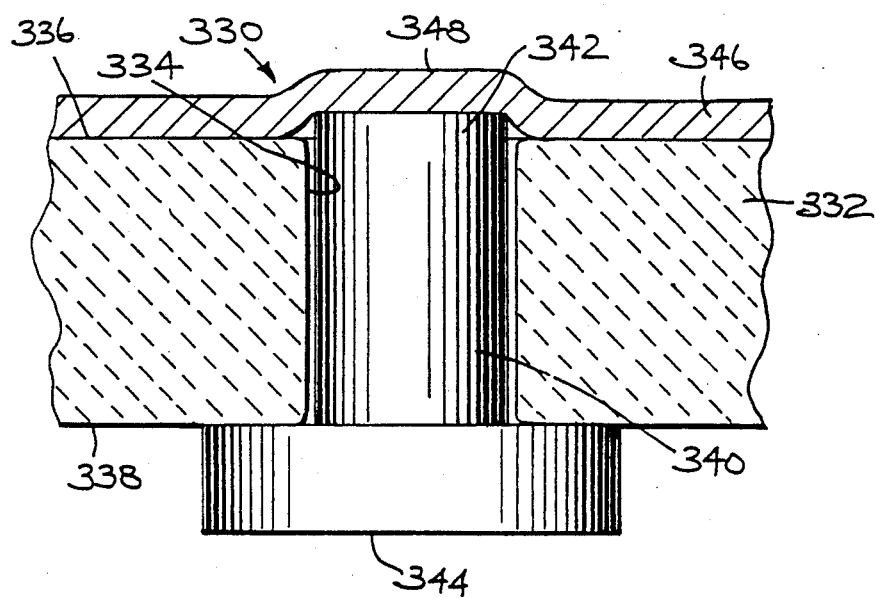

FIG. 18 is a sectional view showing an alternate embodiment.

Figure 19:
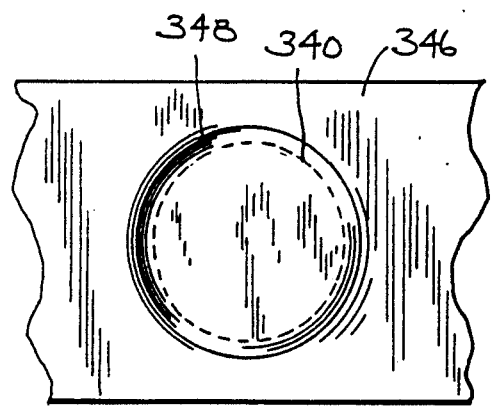

FIG. 19 is a top view of the structure of FIG. 18.

DETAILED DESCRIPTION

Parent Applications

Figure 1:
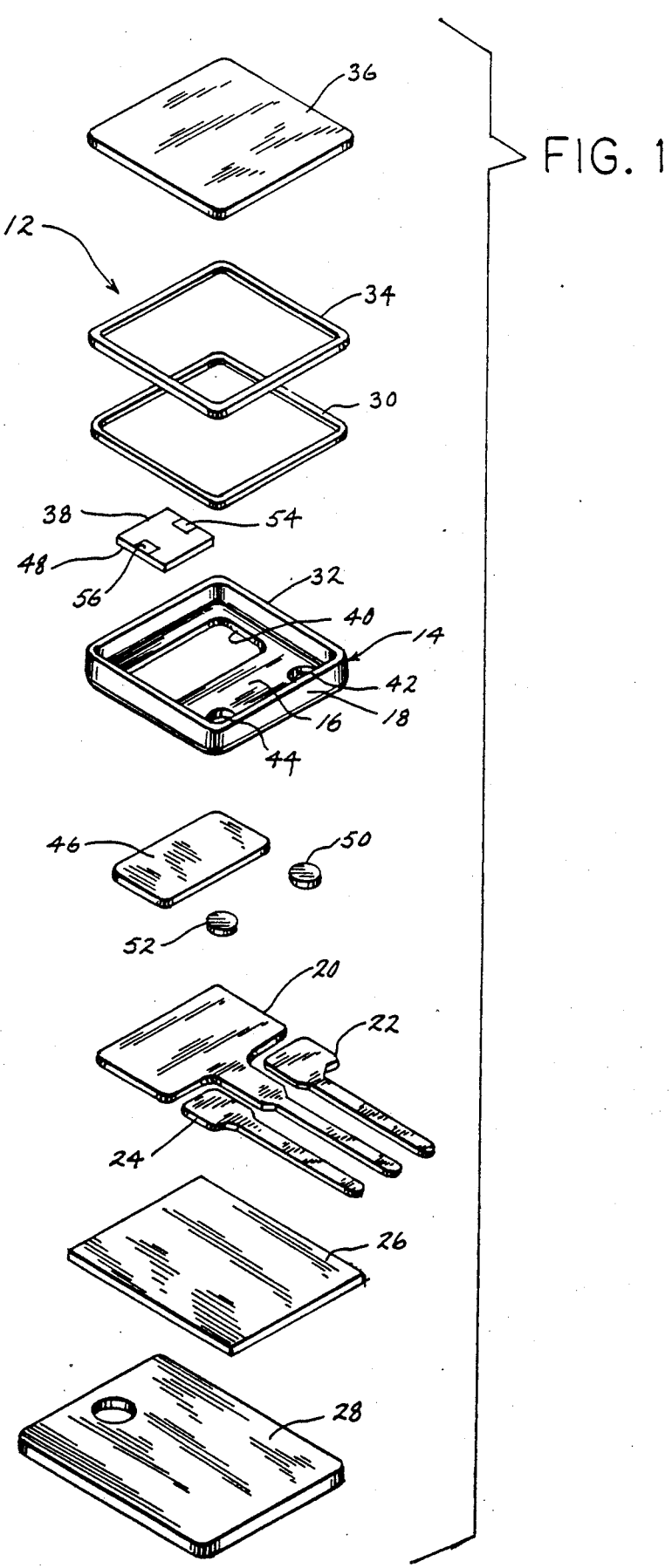
FIG. 1 is an exploded perspective view of an electric circuit assembly.

FIGS. 1-3 show an electric circuit assembly 12. An electrically insulating refractory ceramic tub 14 has a floor 15 and an integral side wall 18 around the perimeter thereof and extending upwardly therefrom. Tub 14 is placed in contact with electrically conductive copper lead frames 20, 22, 24 therebelow, which in turn are placed in contact with electrically insulating refractory ceramic substrate 26 therebelow, which in turn is placed in contact with electrically conductive copper base plate 28 therebelow. A copper ring 30 is placed in contact with the top 32 of side wall 18 of tub 14. A second copper ring 34 is placed in contact with the underside of an electrically insulating refractory ceramic top cover 36.

The assemblies are then directly and hermetically bonded. Copper ring 30, ceramic tub 14, copper lead frames 20, 22, 24, ceramic substrate 26, and copper base plate 28 are placed in the noted contact and heated to a temperature below the melting point of copper ring 30, copper lead frames 20, 22, 24, and copper base plate 28 to form a eutectic with the copper which wets such copper members and the noted ceramic members in contact therewith. The assembly is then cooled, with copper ring 30 bonded to the top 32 of side wall 18 of tub 14 therebelow, and with lead frames 20, 22, 24 bonded to the bottom of floor 16 of tub 14 thereabove, and with lead frames 20, 22, 24 bonded to the top of ceramic substrate 26 therebelow, and with copper base plate 28 bonded to the bottom of ceramic substrate 26 thereabove. The copper members are pre-oxidized, and the assembly is heated in an inert atmosphere, or alternately the assembly is heated in a reactive oxidation atmosphere. The direct bond process is disclosed in U.S. Pat. Nos. 3,744,120, 3,766,634, 3,854,892, 3,911,553, 3,993,411, 3,994,430, 4,129,243, and further reference may be had to "Over 50 Years of Experience With The Direct Bond Copper Process", Tegmen Corp., 1201 East Fayette Street, Syracuse, New York. Copper ring 34 is directly and hermetically bonded to the underside of ceramic top cover 36 in like manner. An electrical component provided by semiconductor chip 38 is then mounted in the tub and connected to the lead frames. The top cover 36 is hermetically sealed to the top of the side wall of the tub, by welding rings 30 and 34 to each other.

Tub 14 sits on lead frames 20, 22, 24 with the bottom of floor 16 bonded to the top of the lead frames. Floor 16 has a plurality of apertures 40, 42, 44, therethrough. Semiconductor chip 38 is connected to the lead frames through the apertures. Lead frame 20 has a portion 46 extending upwardly in aperture 40. Portion 46 may be formed by half-etching lead frame 20, for example as shown in U.S. Pat. No. 4,630,174, or portion 46 may be soldered or welded to lead frame 20 and/or directly bonded to the sides of aperture 40. Semiconductor chip 38 has a lower contact pad 48 mounted on portion 46 by soldered reflow and in electrical contact with portion 46. Lead frames 22 and 24 have portions 50 and 52 extending upwardly in respective apertures 42 and 44 which likewise may be formed by half-etching, or may be separate pieces welded or soldered to the rest of the lead frame therebelow and/or directly bonded to the sides of the apertures. Semiconductor chip 38 has a pair of upper contact pads 54 and 56 connected by sonically or thermally welded respective jumper leads 58 and 60 to lead frame portions 50 and 52. In the case of a FET chip, lower contact pad 48 is the drain, and upper contact pads 54 and 56 are the source and gate.

FIG. 4 shows an alternate embodiment for a surface mount configuration, without lower ceramic substrate 26 and copper base plate 28. Modified lead frames 20a, 22a, 24a, correspond respectively to lead frames 20, 22, 24, and have respective integral portions 46a, 50a, 52a extending upwardly into apertures 40, 42, 44.

Figure 5:
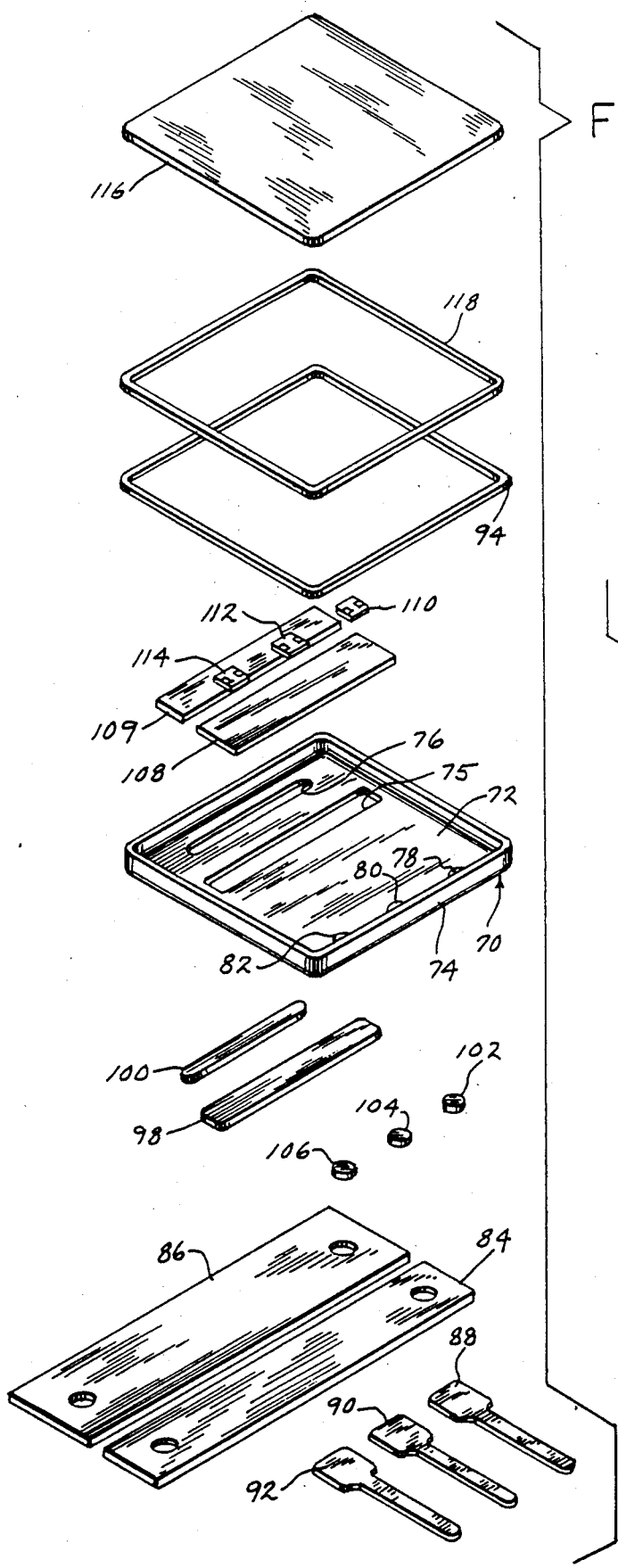
FIG. 5 is an exploded perspective view of another embodiment of an electric circuit assembly.
Figure 8:
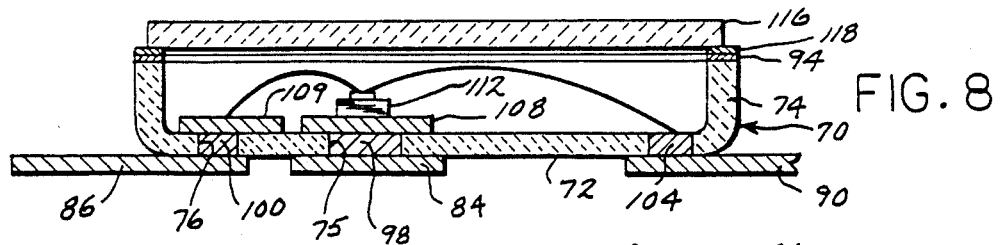
FIG. 8 is a sectional view of the assembled structure of FIG. 5.

FIGS. 5 and 8 show a further embodiment. Ceramic tub 70 has a floor 72 and an integral side wall 74 around the perimeter thereof and extending upwardly therefrom. Floor 72 has a pair of oblong extended apertures 75 and 76 therethrough and a plurality of gate lead apertures 78, 80, 82 therethrough. The bottom of floor 72 is directly bonded to a pair of flat copper conductive lead frames 84, 86, and gate lead frames 88, 90, 92, therebelow. Copper ring 94 is directly bonded on the top 96 of side wall 74. Lead frames 84, 86, 88, 90, 92 have respective portions 98, 100, 102, 104, 106 extending upwardly in respective apertures 75, 76, 78, 80, 82. A further lead frame portion 108 is provided over aperture 75 on lead frame portion 98 to provide a wider drain contact attachment area for the lower drain contacts of FET chips 110, 112, 114. A further lead frame portion 109 is provided over aperture 76 on lead frame portion 100 to provide a wider contact attachment area for the source lead wires from the FET chips. The FET chips are connected in parallel on portion 108 on portion 98 of drain lead frame 84, with respective jumper wires connected in parallel to portion 109 on portion 100 of source lead frame 86, and with respective gate jumper wires connected to respective portions 102, 104, 106 of gate lead frames 88, 90, 92. Lead frame portion 98 of lead frame 84 is formed by half-etching as noted above, or is a separate piece soldered or welded to lead frame 84 and/or directly bonded to the sides of aperture 75. The remaining lead frame portions are comparably provided. Lead frame portions 108 and 109 are soldered or welded on respective lead frame portions 98 and 100 after the direct bond step, or are placed on respective lead frame portions 98 and 100 over respective apertures 75 and 76 and directly bonded to the top of floor 72. Ceramic top cover 116 has a copper ring 118 directly bonded to the underside thereof. Rings 94 and 118 are welded to each other to hermetically seal top cover 116 to tub 70.

Figure 6:
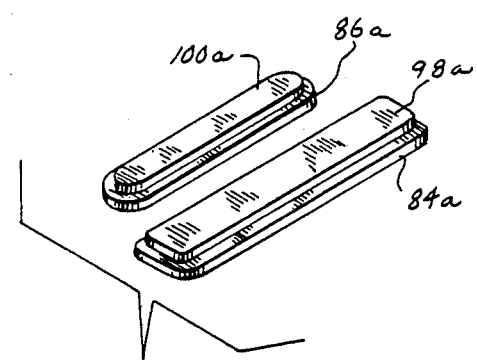
FIG. 6 is a perspective view of an alternate embodiment of a portion of the structure of FIG. 5.

FIG. 6 shows modified lead frames 84a and 86a corresponding respectively to lead frames 84 and 86, and with portions 98a and 100a extending upwardly therefrom and corresponding to portions 98 and 100.

Figure 7:
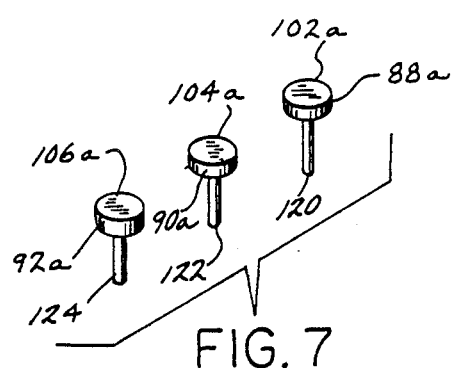
FIG. 7 is a perspective view of an alternate embodiment of a portion of the structure of FIG. 5.

FIG. 7 shows modified gate lead frames 88a, 90a, 92a, corresponding respectively to gate lead frames 88, 90, 92. Gate lead frames 88a, 90a, 92a, have upper head portions 102a, 104a, 106a corresponding respectively to portions 102, 104, 106, and which are received in respective apertures 78, 80, 82, of the floor 72 of tub 70 and directly bonded thereto. Gate lead frames 88a, 90a, 92a, have lower stems 120, 122, 124 extending downwardly therefrom below floor 72 of tub 70.

Figure 9:
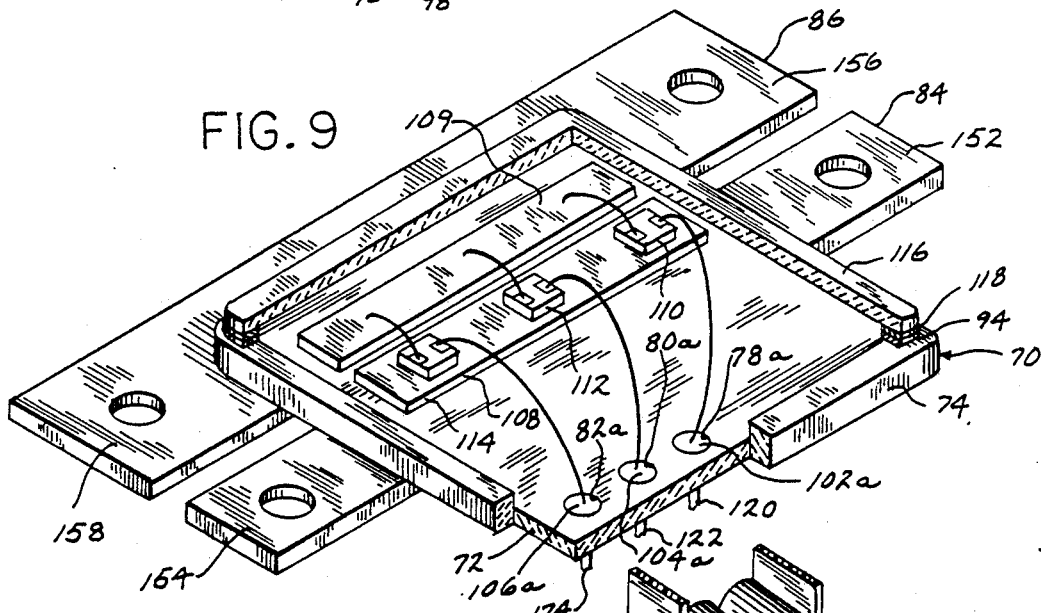
FIG. 9 is a perspective assembled view of structure similar to FIG. 5 and with further modifications.

FIG. 9 shows an assembled view of the structure of FIG. 5, but modified to incorporate the gate lead frames of FIG. 7, and with gate lead frame apertures 78a, 80a, 82a, moved to one side of the tub. For clarity of illustration, simple gating circuitry is shown, though it is within the scope of the invention to include further control gating circuitry within the tub as desired for particular implementations. FIG. 9 shows a single tub 70 which forms the basic building block for multi-tub structure of FIG. 10.

Figure 10:
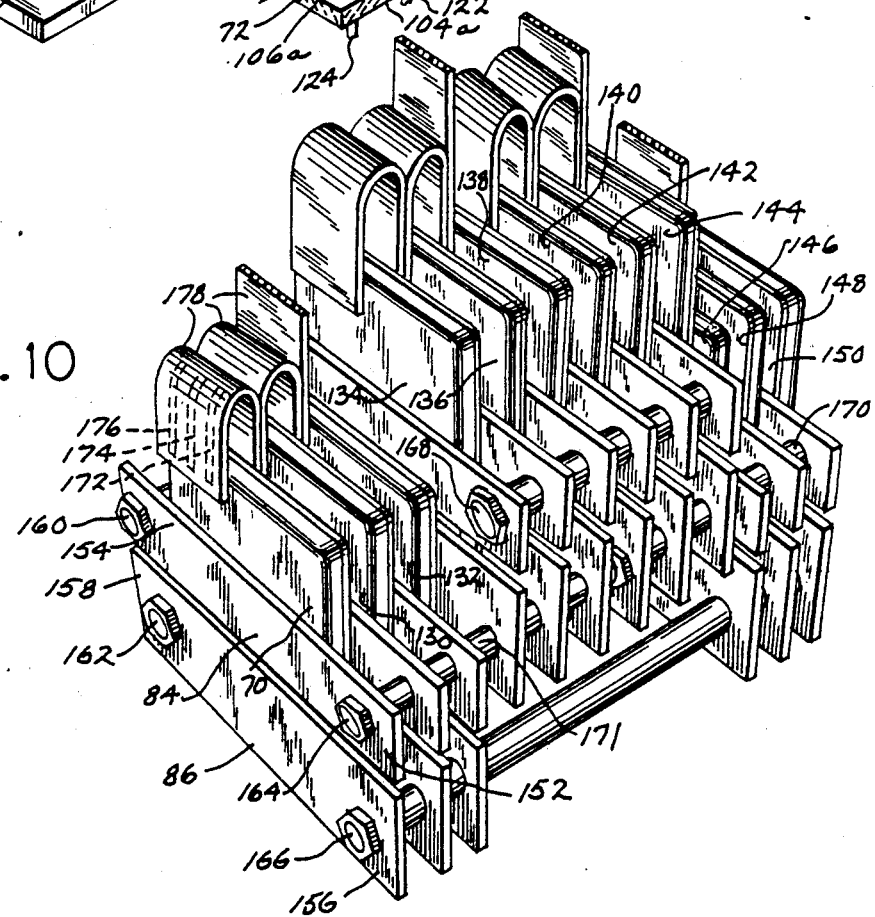
FIG. 10 is a perspective view of a further electric circuit assembly.
Figure 11:
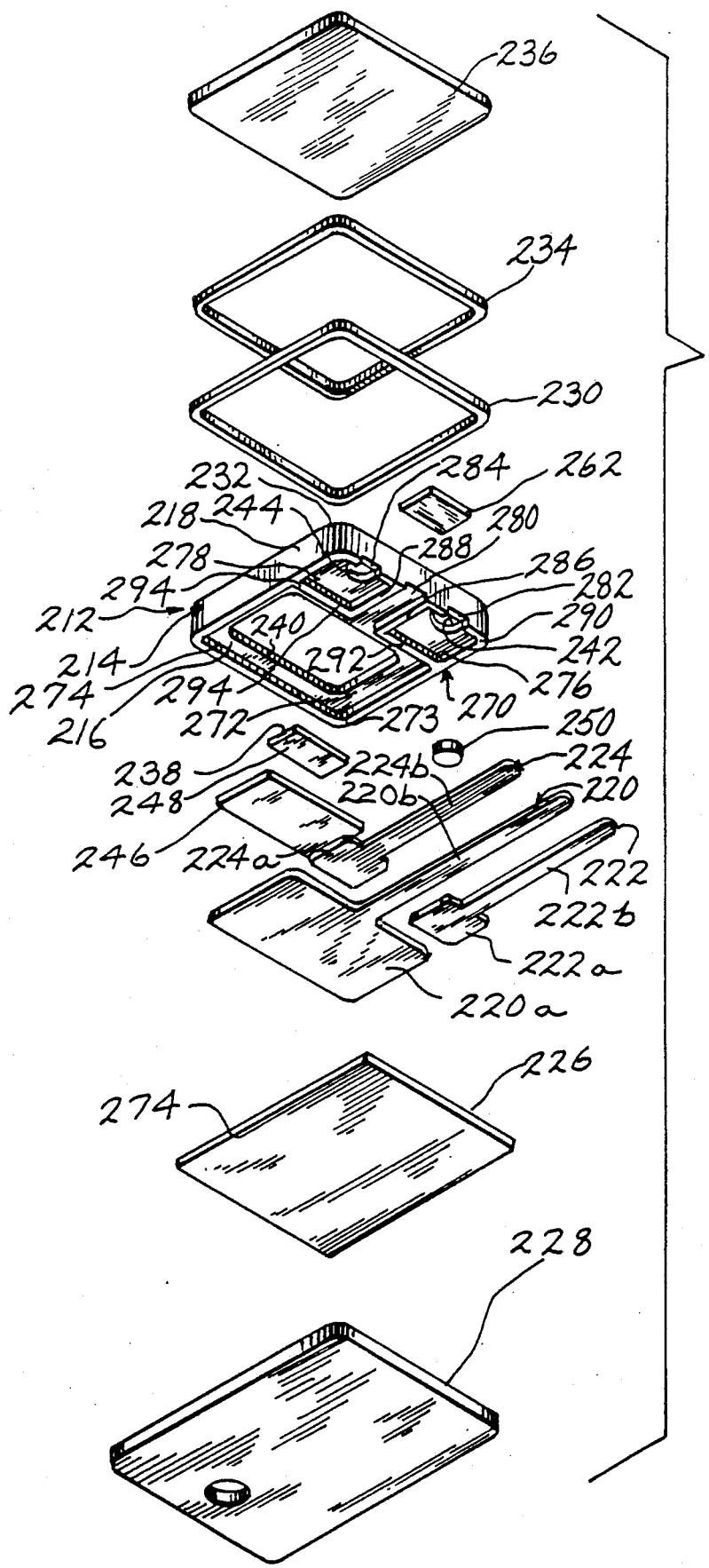
FIG. 11 is an exploded perspective view of another electric circuit assembly.
Figure 12:
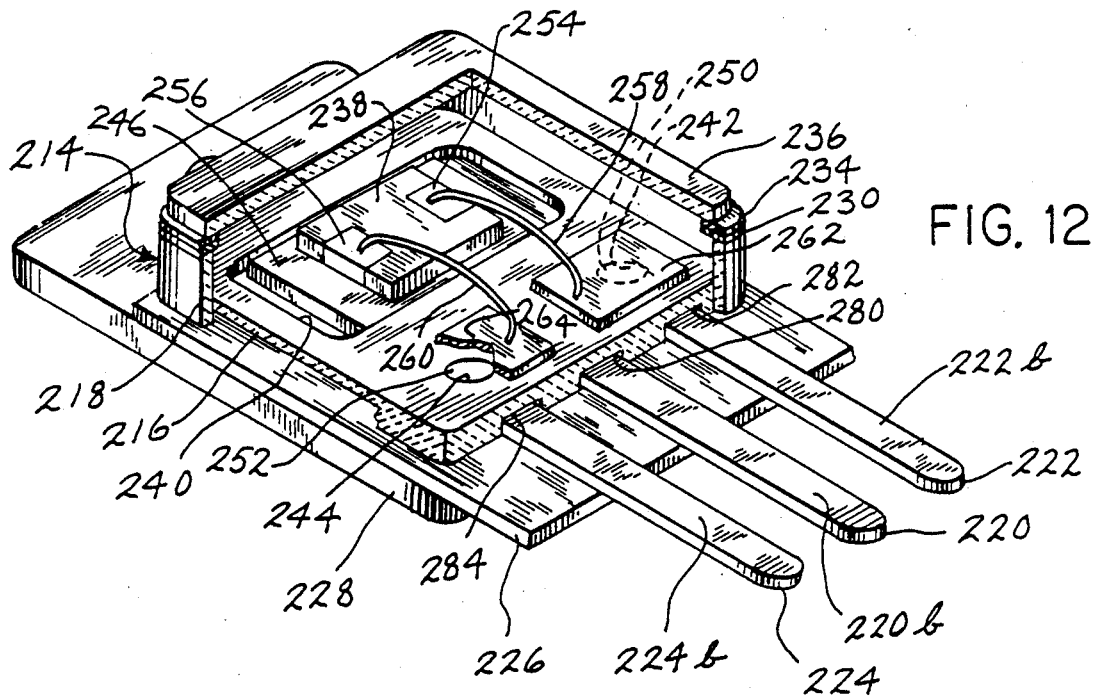
FIG. 12 is an assembled view of the structure of FIG. 11, partially cut away.

FIG. 10 shows a plurality of ceramic tubs 70, 130, 132, 134, 136, 138, 140, 142, 144, 146, 148, 150, stacked on top of each other. Each tub has a floor and an integral side wall around the perimeter thereof and extending upwardly therefrom. Each tub has a pair of flat copper conductor lead frames comparable to lead frames 84 and 86 directly and hermetically bonded thereto as above described. Each tub has a top cover comparable to cover 116 hermetically sealed to the top of the side wall of the tub to close the latter and hermetically seal the respective semiconductor chips.

Lead frame 84 has distal end portions 152 and 154 extending laterally oppositely beyond opposite distal sides of tub 70. Lead frame 86 has distal end portions 156 and 158 extending laterally oppositely beyond the opposite distal sides of tub 70. The other comparable lead frames of the other tubs likewise have distal ends extending laterally oppositely beyond the opposite distal sides of the respective tubs. The tubs are held together in stacked relation by mounting bolts, some of which are seen at 160, 162, 164, 166, 168, 170. The mounting bolts engage the lead frames at the laterally extended distal end portions. The mounting bolts extend upwardly along the stack and perpendicularly to the flat lead frames and extend through apertures in the distal ends of the lead frames. The bolts also extend through hollow cylindrical spacers 171 between the lead frames and which has a length about equal to the height of a tub and cover and which space the ends of the lead frames accordingly. The bolts clamp the lead frames and spacers into mechanical and electrical contact. The lead frames are also spaced by the tubs and covers therebetween. The tubs sit on the central portions of the respective lead frames with the bottom of the floor of each tub bonded to the top of the respective pair of lead frames The tubs are spaced by the lead frames therebetween.

Additional spacers may be provided between the tub cover and the next lead frame thereabove, with accordingly longer spacers at the ends of the lead frames, if a larger gap is desired for cooling purposes, e.g. for air or liquid flow therethrough. Gate lead frame stems such as 120, 122, 124, are connected to respective conductor strip patterns 172, 174, 176, on an insulating film 178. The particular electrical contact connection pattern in FIG. 9 is an H-bridge with each tub having three semiconductor switches connected in parallel and in parallel with the three chips in each of two other tubs. Gating strip 178 and its conductive strips are connected to the gate lead frame stems for tubs 70, 130 and 132. Tubs 70, 130 and 132 provide one leg of the H-bridge. A second leg of the H-bridge is provided by tubs 134, 136, 138. The third leg of the H-bridge is provided by tubs 140, 142, 144. The fourth leg of the H-bridge is provided by tubs 146, 148, 150. Bolts 166 and 168 are connected to the load. Bolts 164 and 170 are connected to the AC source. Other stacked structures may of course be constructed. Each tub and cover is an individual hermetic package. The packages are mechanically supported and electrically connected by the bolts and spacers.

FIGS. 11-16 show an electric circuit assembly 212. An electrically insulating refractory ceramic tub 214 has a substrate floor 216, FIG. 12, and an integral side wall 218 around the perimeter thereof and extending upwardly therefrom. Tub 214 is placed in contact with electrically conductive copper lead frames 220, 222, 224 therebelow, which in turn are placed in contact with electrically insulating refractory ceramic substrate 226 therebelow, which in turn is placed in contact with electrically conductive copper base plate 228 therebelow. A copper ring 230 is placed in contact with the top 232 of side wall 218 of tub 214. A second copper ring 234 is placed in contact with the underside of an electrically insulating refractory ceramic top cover 236.

The assemblies are then directly and hermetically bonded. Copper ring 230, ceramic tub 214, copper lead frames 220, 222, 224, ceramic substrate 226, and copper base plate 228 are placed in the noted contact and heated to a temperature below the melting point of copper ring 230, copper lead frames 220, 222, 224, and copper base plate 228 to form a eutectic with the copper which wets such copper members and the noted ceramic members in contact therewith. The assembly is then cooled, with copper ring 230 bonded to the top 232 of side wall 218 of tub 214 therebelow, and with lead frames 220, 222, 224 bonded to the bottom of substrate floor 216 of tub 214 thereabove, and with lead frames 220, 222, 224 bonded to the top of ceramic substrate 226 therebelow, and with copper base plate 228 bonded to the bottom of ceramic substrate 226 thereabove. The copper members are preoxidized, and the assembly is heated in an inert atmosphere, or alternately the assembly is heated in a reactive oxidation atmosphere. Copper ring 234 is directly and hermetically bonded to the underside of ceramic top cover 236 in like manner. An electrical component provided by semiconductor chip 238 is then mounted in the tub and connected to the lead frames. The top cover 236 is hermetically sealed to the top of the side wall of the tub, by welding rings 230 and 234 to each other.

Substrate floor 216 has a plurality of apertures 240, 242, 244, therethrough. Semiconductor chip 238 is connected to the lead frames through the apertures. Lead frame 220 has a portion 246 extending upwardly in aperture 240. Portion 246 may be formed by half-etching lead frame 220, for example as shown in U.S. Pat. No. 4,630,174, or portion 246 may be soldered or welded to lead frame 220, and/or directly bonded to the sides of aperture 240. Semiconductor chip 238 has a lower contact pad 248 mounted on portion 246 by solder reflow and in electrical contact with portion 246. Lead frames 222 and 224 have portions 250 and 252, FIGS. 11, 12 and 15, extending upwardly in respective apertures 242 and 244 which likewise may be formed by half-etching, or may be separate pieces welded or soldered to the rest of the lead frame therebelow and/or directly bonded to the sides of the apertures. Semiconductor chip 238 has a pair of upper contact pads 254 and 256, FIG. 12, connected by sonically or thermally welded respective jumper leads 258 and 260 to respective lead frame portions 250 and 252 as above, or to respective terminal connection pads 262 and 264 sonically or thermally welded or directly bonded on respective portions 250 and 252. In the case of a FET chip, lower contact pad 248 is the drain, and upper contact pads 254 and 256 are the source and gate.

Tub 214 has a lower configured multi-partitioned integral wall 270 extending downwardly from the underside 272 of substrate floor 216. The bottom 273 of wall 270 engages the top side 274 of lower substrate 226 and is sealed thereto by electrically insulating sealing material. The multi-partitioned wall 270 defines recesses 274, 276, 278 in the lower surface of the tub below respective apertures 240, 242, 244. Each lead frame has a respective pad portion 220a, 222a, 224a in a respective recess 274, 276, 278. Each lead frame has a respective extension portion 220b, 222b, 224b extending laterally beyond substrates 216 and 226 through a respective slot 280, 282, 284 in wall 270. Wall 270 includes a dividing wall portion 286 between lead frames 220 and 222, and a dividing wall portion 288 between lead frames 220 and 224, which dividing wall portions provide electrical isolation and prevent sparking or voltage crossover between respective lead frames.

Multi-partitioned wall 270 includes an outer peripheral portion 290 generally defining a chamber and generally enclosing the space between substrates 216 and 226 and encompassing recesses 274, 276, 278. Dividing wall portions 286 and 288 are part of inner wall portions dividing the chamber into compartments defining the recesses and receiving respective lead frames. Recess 274 is separated from recess 276 by a first L-shaped dividing wall having a first leg 292 between pad portion 220a of lead frame 220 and pad portion 222a of lead frame 222, and having a second leg provided by above noted dividing wall portion 286 between extension portion 220b of lead frame 220 and pad portion 222a of lead frame 222. Recess 278 is separated from recess 274 by a second L-shaped dividing wall having a first leg 294 between pad portion 224a of lead frame 224 and pad portion 220a of lead frame 220, and having a second leg provided by above noted dividing wall portion 288 between pad portion 224a of lead frame 224 and extension portion 220b of lead frame 220. Pad portions 222a and 224a are spaced and separated by extension portion 220b and dividing wall portions 286 and 288 extending therebetween. The height of wall 270, the depth of recesses 274, 276, 278, and the height of lead frames 220, 222, 224, are all substantially the same such that the bottom 273 of tub 214 is substantially flush with the bottom of the lead frames. The lead frames engage both the underside 272 of substrate 216 and the top side 274 of substrate 226.

Figure 13:
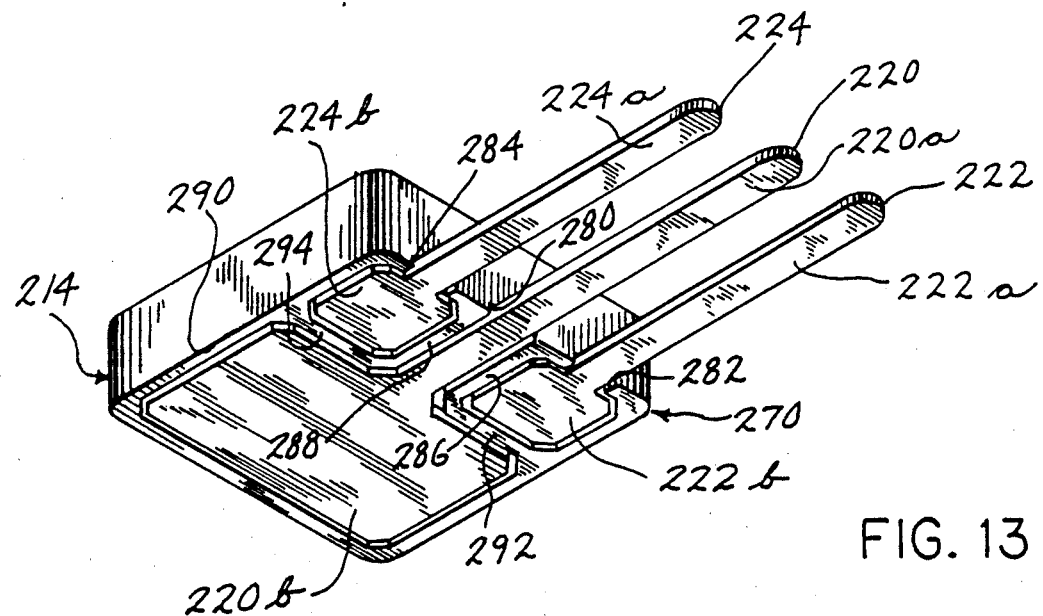
FIG. 13 is a view from below of a portion of the structure of FIG. 12.
Figure 14:
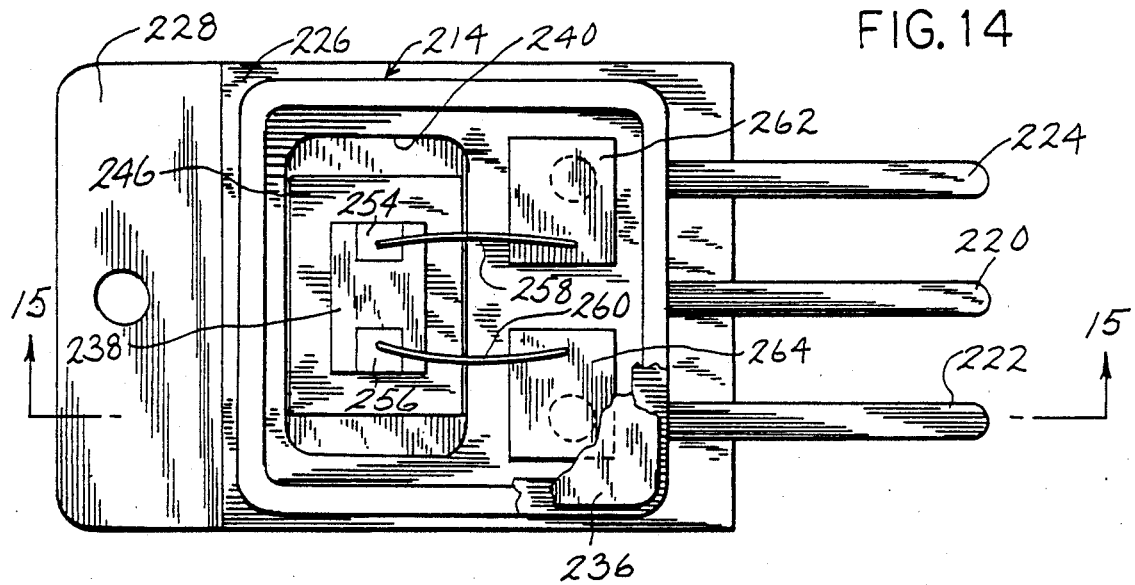
FIG. 14 is a top view of the structure of FIG. 12, partially cut away.
Figure 15:
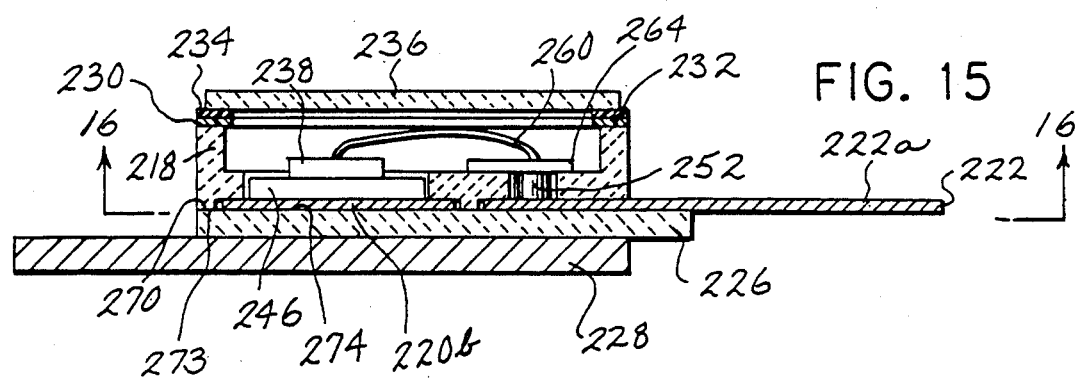
FIG. 15 is a sectional view taken along line 15—15 of FIG. 14.
Figure 16:
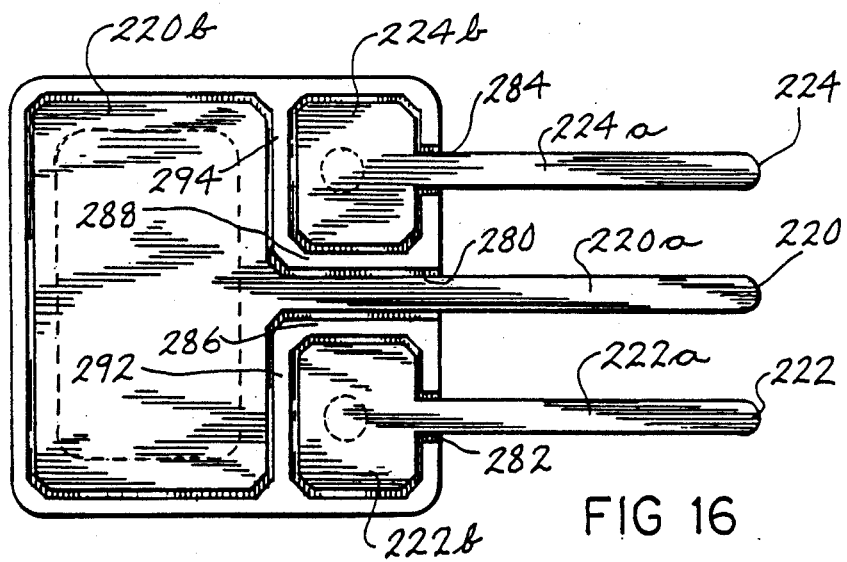
FIG. 16 is a bottom view of a portion of the structure of FIG. 14.

The above circuit assemblies and methods may be practiced with or without hermetic sealing, i.e. with or without upper side wall 218 of the tub, top cover 236, etc. The space between substrates 216 and 226 is not sealed because of the passage of extension portions 220b, 222b, 224b of the lead frames through respective slots 280, 282, 284 in the outer peripheral portion 290 of wall 270. The space between substrates 216 and 226 may be sealed if desired by sealing the interface between the lead frame extensions and respective slots 280, 282, 284, for example by providing electrically insulating sealing material at such interface, or by sealing same during the above noted direct bond process by directly bonding the lead frame extensions to the ceramic material of wall 270 of the tub. In a further alternative, the circuit assembly may be provided to the user as shown in FIG. 13, without substrate 226 and base plate 228.

Present Invention

FIG. 17 shows an electric circuit assembly 300. An electrically insulating refractory substrate 302, preferably ceramic, and which may be the floor of the above noted tub, has an aperture 304 extending therethrough between top surface 306 and bottom surface 308. An electrically conductive metallic terminal pin 310, preferably copper, is in aperture 304 and is directly bonded to substrate 302 by placing the pin in contact with the substrate, heating the pin and the substrate to a temperature below the melting point of the pin to form a eutectic with the pin which wets the pin and the substrate, and cooling the pin and the substrate, with the pin bonded to the substrate. An electrically conductive metallic lead frame 312, preferably copper or copper clad molybdenum, has an aperture 314 extending therethrough between top surface 316 and bottom surface 318. Lead frame 312 is directly bonded to substrate 302, preferably during the same direct bonding step for bonding pin 310 to substrate 302. Top surface 316 of lead frame 312 is placed in contact with bottom surface 308 of substrate 302 such that apertures 304 and 314 are aligned, and with pin 310 extending therethrough. Pin 310, lead frame 312, and substrate 302 are heated to a temperature below the melting point of pin 310 and lead frame 312 to form a eutectic with pin 310 and with lead frame 312 which wets pin 310 and substrate 302 and wets lead frame 312 and substrate 302. Pin 310 and lead frame 312 and substrate 302 are then cooled, with pin 310 bonded to substrate 302 and with lead frame 312 bonded to substrate 302. Copper members 310 and 312 are pre-oxidized, and the assembly is heated in an inert atmosphere, or alternatively the assembly is heated in a reactive oxidation atmosphere. An electrical component provided by semiconductor chip 320 is then mounted on pin 310, by soldering or the like, and connected as desired to remaining components or lead frames on substrate 302 or within the ceramic tub as noted above.

Pin 310 has upper and lower distally opposite enlarged heads 322 and 324. Upper head 322 engages top surface 306 of substrate 302. Lower head 324 engages bottom surface 318 of lead frame 312. One of the heads, such as head 322, is a preformed flange having a diameter greater than the diameter of aperture 304. The other head, such as head 324, is deformed after insertion of pin 310 through apertures 304 and 314. Various deformation techniques may be used, such as thermal deformation, sonic welding, mechanical staking, upsetting or crimping of material, etc. It is preferred that head 324 be enlarged by thermal deformation during the above noted heating during direct bonding. Heads 322 and 324 enable pin 310 to additionally retain lead frame 312 against substrate 302 in rivet-like manner with compressive clamping force.

FIG. 18 shows an electric circuit assembly 330. An electrically insulating refractory substrate 332, preferably copper, has an aperture 334 extending therethrough between top surface 336 and bottom surface 338. An electrically conductive metallic terminal pin 340, preferably copper, is provided in aperture 334 and has upper and lower ends 342 and 344. Lower end 344 is formed by an enlarged flange head engaging bottom surface 338 of substrate 332. Upper end 342 extends out of aperture 334 slightly beyond top surface 336 of substrate 332. Pin 340 is directly bonded to substrate 332 by placing pin 340 in contact with substrate 332, heating pin 340 and substrate 332 to a temperature below the melting point of pin 340 to form a eutectic with pin 340 which wets pin 340 and substrate 332, and then cooling pin 340 and substrate 332, with pin 340 bonded to substrate 332.

An electrically conductive metallic lead frame 346, preferably copper, is directly bonded to substrate 332, preferably during the same direct bonding step in which pin 340 is bonded to substrate 332. Lead frame 346 is placed in contact with top surface 336 of substrate 332. Pin 340 and lead frame 346 and substrate 332 are heated to a temperature below the melting point of pin 340 and lead frame 346 to form a eutectic with pin 340 which wets pin 340 and substrate 332, and to form a eutectic with lead frame 346 which wets lead frame 346 and substrate 332. Pin 340 and lead frame 346 and substrate 332 are then cooled, with pin 340 bonded to substrate 332, and with lead frame 346 bonded to substrate 332. Copper members 340 and 346 are pre-oxidized, and the assembly is heated in an inert atmosphere, or alternatively the assembly is heated in a reactive oxidation atmosphere. Lead frame 346 has an electrical component, such as semiconductor chip 320, mounted thereto, and/or is connected to other components or lead frames on substrate 332 or within a ceramic tub, by lead wires or the like, all as above.

Lead frame 346 extends along top surface 336 of substrate 332 and has a humped configuration 348 over aperture 334. Lead frame 346 at its humped configuration 348 engages upper end 342 of pin 340 and is deformed and raised thereby away from top surface 336 of substrate 332. In one embodiment, FIG. 19, lead frame 346 engages and is directly bonded to top surface 336 of substrate 332 around the entire perimeter of upper end 342 of pin 340 and forms a hermetic seal with top surface 336 of substrate 332 peripherally surrounding upper end 342 of pin 340.

It is recognized that various equivalents, alternatives and modifications are possible within the scope of the appended claims.

I claim:

1. An electric circuit assembly comprising:
   an electrically insulating refractory substrate having an aperture extending therethrough between first and second surfaces;
   an electrically conductive terminal pin in said aperture directly bonded to said substrate by placing said pin in contact with said substrate, heating said pin and said substrate to a temperature below the melting point of said pin to form a eutectic with said pin which wets said pin and said substrate, and cooling said pin and said substrate, with said pin bonded to said substrate;

an electrically conductive lead frame having an aperture extending therethrough between first and second surfaces, said lead frame being directly bonded to said substrate by placing said first surface of said lead frame in contact with said second surface of said substrate, heating said lead frame and said substrate to a temperature below the melting point of said lead frame to form a eutectic with said lead frame which wets said lead frame and said substrate, and cooling said lead frame and said substrate, with said lead frame bonded to said substrate, and with said aperture in said lead frame aligned with said aperture in said substrate, and with said pin in said apertures.

2. The assembly according to claim 1 wherein said pin has first and second distally opposite enlarged heads, said first head engaging said first surface of said substrate, said second head engaging said second surface of said lead frame.

3. The assembly according to claim 2 wherein one of said heads comprises a preformed flange, and wherein said pin is inserted through said apertures, and wherein the other of said heads is deformed after insertion of said pin through said apertures.

4. The assembly according to claim 3 wherein said other head is thermally deformed during said heating during direct bonding.

5. An electric circuit assembly comprising:
an electrically insulating refractory substrate having an aperture extending therethrough between first and second surfaces;
an electrically conductive terminal pin in said aperture directly bonded to said substrate by placing said pin in contact with said substrate, heating said pin and said substrate to a temperature below the melting point of said pin to form a eutectic with said pin which wets said pin and said substrate, and cooling said pin and said substrate, with said pin bonded to said substrate, said pin having first and second ends, said first end of said pin extending out of said aperture and slightly beyond said first surface of said substrate;
an electrically conductive lead frame directly bonded to said substrate by placing said lead frame in contact with said first surface of said substrate, heating said lead frame and said substrate to a temperature below the melting point of said lead frame to form a eutectic with said lead frame which wets said lead frame and said substrate, and cooling said lead frame and said substrate, with said lead frame bonded to said substrate, said lead frame extending over said first end of said terminal pin and drooping therearound and conforming thereto during said heating.

6. The assembly according to claim 5 wherein said lead fame extends along said first surface of said substrate and has a humped configuration over said aperture in said substrate.

7. The assembly according to claim 6 wherein said humped configuration of said lead frame engages said first end of said pin and is deformed and raised thereby away from said first surface of said substrate.

8. The assembly according to claim 7 wherein said lead frame engages and is directly bonded to said first surface of said substrate around the entire perimeter of said first end of said pin and forms a hermetic seal with said first surface of said substrate peripherally surrounding said first end of said pin.

9. The assembly according to claim 8 wherein said second end of said pin is an enlarged preformed flange engaging said second surface of said substrate.

10. An electric circuit assembly comprising:
an electrically insulating refractory substrate having an aperture extending therethrough between first and second surfaces;
an electrically conductive terminal pin directly bonded to said substrate by placing said pin in contact with said substrate, heating said pin and said substrate to a temperature below the melting point of said pin to form a eutectic with said pin which wets said pin and said substrate, and cooling said pin and said substrate, with said pin bonded to said substrate, said pin having first and second distally opposite ends, said first end of said pin extending out of said aperture and slightly beyond said first surface of said substrate;
an electrically conductive lead frame directly bonded to said first surface of said substrate during said direct bonding of pin to said substrate, said lead frame extending over said first end of said terminal pin and drooping therearound and conforming thereto during said heating during direct bonding such that said lead frame has a humped configuration over said aperture in said substrate and engaging said first end of said pin and deformed and raised thereby away from said first surface of said substrate.

11. A method for making an electric circuit assembly comprising:
providing an electrically insulating refractory substrate having an aperture extending therethrough between first and second surfaces;
providing an electrically conductive terminal pin in said aperture and directly bonding said pin to said substrate by placing said pin in contact with said substrate, heating said pin and said substrate to a temperature below the melting point of said pin to form a eutectic with said pin which wets said pin and said substrate, and cooling said pin and said substrate, with said pin bonded to said substrate;
providing an electrically conductive lead frame having an aperture extending therethrough between first and second surfaces, and directly bonding said lead frame to said substrate by placing said first surface of said lead frame in contact with said second surface of said substrate such that said apertures are aligned, heating said lead frame and said substrate to a temperature below the melting point of said lead frame to form a eutectic with said lead frame which wets said lead frame and said substrate, and cooling said lead frame and said substrate, with said lead frame bonded to said substrate, and with said pin in said apertures.

12. The method according to claim 11 wherein said pin has first and second distally opposite ends, and comprising inserting said pin through said apertures, and deforming one of said ends to enlarge same after insertion of said pin through said apertures.

13. The method according to claim 12 comprising enlarging said one end of said pin by thermally deforming same said during said heating during direct bonding.

14. The method according to claim 11 comprising directly bonding said pin to said substrate and directly bonding said lead frame to said substrate during the same direct bonding step by heating said pin and said lead frame and said substrate to a temperature below the melting point of said pin and said lead frame to form a eutectic with said pin and a eutectic with said lead frame which wets said pin and said substrate and which wets said lead frame and said substrate, and cooling said pin and said lead frame and said substrate, with said pin bonded to said substrate and with said lead frame bonded to said substrate.

15. The method according to claim 11 comprising providing said pin with an enlarged flange head at one end, inserting said pin through said apertures, and forming an enlarged head at the other end of said pin by deforming same after insertion of said pin through said apertures, such that said pin also aids in retaining said lead frame against said substrate in rivet-like manner.

16. A method for making an electric circuit assembly comprising:
   providing an electrically insulating refractory substrate having an aperture extending therethrough between first and second surfaces;
   providing an electrically conductive terminal pin in said aperture and directly bonding said pin to said substrate by placing said pin in contact with said substrate, heating said pin and said substrate to a temperature below the melting point of said pin to form a eutectic with said pin which wets said pin and said substrate, and cooling said pin and said substrate, with said pin bonded to said substrate, said pin having first and second ends, said first end of said pin extending out of said aperture slightly beyond said first surface of said substrate;
   providing an electrically conductive lead frame and directly bonding said lead frame to said substrate by placing said lead frame in contact with said first surface of said substrate, heating said lead frame and said substrate to a temperature below the melting point of said lead frame to form a eutectic with said lead frame which wets said lead frame and said substrate, and cooling said lead frame and said substrate, with said lead frame bonded to said substrate, said lead frame extending over said first end of said terminal pin and drooping therearound and conforming thereto during said heating.

17. The method according to claim 16 comprising directly bonding said lead frame to said first surface of said substrate such that said lead frame has a humped configuration over said aperture and engaging said first end of said pin and deformed and raised thereby away from said first surface of said substrate at said pin.

18. The method according to claim 17 comprising directly bonding said lead frame to said first surface of said substrate around the entire perimeter of said first end of said pin and forming a hermetic seal with said first surface of said substrate peripherally surrounding said first end of said pin.

19. The method according to claim 18 comprising directly bonding said pin to said substrate and directly bonding said lead frame to said substrate during the same direct bonding step, by heating said pin and said lead frame and said substrate to a temperature below the melting point of said pin and said lead frame to form a eutectic with said pin and with said lead frame which wets said pin and said substrate and which wets said lead frame and said substrate, and cooling said pin and said lead frame and said substrate, with said pin bonded to said substrate and with said lead frame bonded to said substrate.

* * * * *